(12) United States Patent
Wieting

(10) Patent No.: US 8,507,786 B1
(45) Date of Patent: Aug. 13, 2013

(54) MANUFACTURING METHOD FOR PATTERNING CIGS/CIS SOLAR CELLS

(75) Inventor: Robert D. Wieting, Simi Valley, CA (US)

(73) Assignee: Stion Corporation, San Jose, CA (US)

( * ) Notice: Subject to any disclaimer, the term of this patent is extended or adjusted under 35 U.S.C. 154(b) by 545 days.

(21) Appl. No.: 12/818,957

(22) Filed: Jun. 18, 2010

Related U.S. Application Data

(60) Provisional application No. 61/221,043, filed on Jun. 27, 2009.

(51) Int. Cl.
*H01L 31/042* (2006.01)

(52) U.S. Cl.
USPC ....... 136/250; 438/66; 257/E25.009; 136/244

(58) Field of Classification Search
None
See application file for complete search history.

(56) References Cited

U.S. PATENT DOCUMENTS

| | | |
|---|---|---|
| 3,520,732 A | 7/1970 | Nakayama et al. |
| 3,828,722 A | 8/1974 | Reuter et al. |
| 3,975,211 A | 8/1976 | Shirland |
| 4,062,038 A | 12/1977 | Cuomo et al. |
| 4,204,933 A | 5/1980 | Barlow et al. |
| 4,213,781 A | 7/1980 | Noreika et al. |
| 4,239,553 A | 12/1980 | Barnett et al. |
| 4,263,336 A | 4/1981 | Thompson et al. |
| 4,332,974 A | 6/1982 | Fraas |
| 4,335,266 A | 6/1982 | Mickelsen et al. |
| 4,347,436 A | 8/1982 | Fukuda et al. |
| 4,441,113 A | 4/1984 | Madan |
| 4,442,310 A | 4/1984 | Carlson et al. |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |

(Continued)

FOREIGN PATENT DOCUMENTS

| | | |
|---|---|---|
| AU | 1998/78651 | 2/1999 |
| AU | 2001/40599 A1 | 8/2001 |

(Continued)

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

(Continued)

*Primary Examiner* — Zandra Smith
*Assistant Examiner* — Pamela E Perkins
(74) *Attorney, Agent, or Firm* — Kilpatrick Townsend & Stockton LLP

(57) ABSTRACT

A method for fabricating a shaped thin-film photovoltaic device. The method includes providing a shaped substrate member including a surface region and forming a first electrode layer overlying the surface region. Additionally, the method includes forming an absorber comprising copper species, indium species, and selenide species overlying the first electrode layer. The method further includes scribing through the absorber using a mechanical tip to form a first pattern. Furthermore, the method includes forming a window layer comprising cadmium sulfide species overlying the absorber including the first pattern. Moreover, the method includes scribing through the window layer and the absorber using the mechanical tip to form a second pattern. The second pattern is separated a distance from the first pattern.

18 Claims, 6 Drawing Sheets

(56) References Cited

U.S. PATENT DOCUMENTS

| | | |
|---|---|---|
| 4,502,225 A | 3/1985 | Lin |
| 4,507,181 A | 3/1985 | Nath et al. |
| 4,517,403 A | 5/1985 | Morel et al. |
| 4,518,855 A | 5/1985 | Malak |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,612,411 A | 9/1986 | Wieting et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,705,912 A | 11/1987 | Nakashima et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,793,283 A | 12/1988 | Sarkozy |
| 4,798,660 A | 1/1989 | Ermer et al. |
| 4,816,082 A | 3/1989 | Guha et al. |
| 4,816,420 A | 3/1989 | Bozler et al. |
| 4,865,999 A | 9/1989 | Xi et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,069,727 A | 12/1991 | Kouzuma et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmon et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,259,883 A | 11/1993 | Yamabe et al. |
| 5,261,968 A | 11/1993 | Jordan |
| 5,298,086 A | 3/1994 | Guha et al. |
| 5,336,623 A | 8/1994 | Sichanugrist et al. |
| 5,346,853 A | 9/1994 | Guha et al. |
| 5,397,401 A | 3/1995 | Toma et al. |
| 5,399,504 A | 3/1995 | Ohsawa |
| 5,421,909 A | 6/1995 | Ishikawa et al. |
| 5,436,204 A | 7/1995 | Albin et al. |
| 5,445,847 A | 8/1995 | Wada |
| 5,474,939 A | 12/1995 | Pollock et al. |
| 5,482,571 A | 1/1996 | Yamada et al. |
| 5,501,744 A | 3/1996 | Albright et al. |
| 5,512,107 A | 4/1996 | van den Berg |
| 5,528,397 A | 6/1996 | Zavracky et al. |
| 5,536,333 A | 7/1996 | Foote et al. |
| 5,578,103 A | 11/1996 | Araujo et al. |
| 5,578,503 A | 11/1996 | Karg et al. |
| 5,589,006 A | 12/1996 | Itoyama et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,726,065 A | 3/1998 | Szlufcik et al. |
| 5,738,731 A | 4/1998 | Shindo et al. |
| 5,855,974 A | 1/1999 | Wu et al. |
| 5,858,819 A | 1/1999 | Miyasaka |
| 5,868,869 A | 2/1999 | Albright et al. |
| 5,948,176 A | 9/1999 | Ramanathan et al. |
| 5,977,476 A | 11/1999 | Guha et al. |
| 5,981,868 A | 11/1999 | Kushiya et al. |
| 5,985,691 A | 11/1999 | Basol et al. |
| 6,001,744 A | 12/1999 | Doi |
| 6,040,521 A | 3/2000 | Kushiya et al. |
| 6,048,442 A | 4/2000 | Kushiya et al. |
| 6,077,722 A | 6/2000 | Jansen et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,134,049 A | 10/2000 | Spiller et al. |
| 6,160,215 A | 12/2000 | Curtin |
| 6,166,319 A | 12/2000 | Matsuyama |
| 6,169,246 B1 | 1/2001 | Wu et al. |
| 6,172,297 B1 | 1/2001 | Hezel et al. |
| 6,258,620 B1 | 7/2001 | Morel et al. |
| 6,288,325 B1 | 9/2001 | Jansen et al. |
| 6,294,274 B1 | 9/2001 | Kawazoe et al. |
| 6,307,148 B1 | 10/2001 | Takeuchi et al. |
| 6,310,281 B1 | 10/2001 | Wendt et al. |
| 6,323,417 B1 | 11/2001 | Gillespie et al. |
| 6,328,871 B1 | 12/2001 | Ding et al. |
| 6,335,479 B1 | 1/2002 | Yamada et al. |
| 6,361,718 B1 | 3/2002 | Shinmo et al. |
| 6,372,538 B1 | 4/2002 | Wendt et al. |
| 6,380,480 B1 | 4/2002 | Norimatsu et al. |
| 6,423,565 B1 | 7/2002 | Barth et al. |
| 6,537,845 B1 | 3/2003 | McCandless et al. |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,692,820 B2 | 2/2004 | Forrest et al. |
| 6,784,492 B1 | 8/2004 | Morishita |
| 6,852,920 B2 | 2/2005 | Sager et al. |
| 6,878,871 B2 | 4/2005 | Scher et al. |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B2 | 6/2007 | Buller et al. |
| 7,252,923 B2 | 8/2007 | Kobayashi |
| 7,265,037 B2 | 9/2007 | Yang et al. |
| 7,303,788 B2 | 12/2007 | Kataokaet et al. |
| 7,319,190 B2 | 1/2008 | Tuttle |
| 7,364,808 B2 | 4/2008 | Sato et al. |
| 7,441,413 B2 | 10/2008 | Bae et al. |
| 7,442,413 B2 | 10/2008 | Zwaap et al. |
| 7,544,884 B2 | 6/2009 | Hollars |
| 7,576,017 B2 | 8/2009 | Tuttle |
| 7,736,755 B2 | 6/2010 | Igarashi et al. |
| 7,741,560 B2 | 6/2010 | Yonezawa |
| 7,846,750 B2 | 12/2010 | Boyer |
| 7,855,089 B2 | 12/2010 | Farris, III et al. |
| 7,863,074 B2 | 1/2011 | Wieting |
| 7,863,518 B2 | 1/2011 | Terakawa et al. |
| 7,875,945 B2 | 1/2011 | Krasnov et al. |
| 7,910,399 B1 | 3/2011 | Wieting |
| 7,955,891 B2 | 6/2011 | Wieting |
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 8,017,860 B2 | 9/2011 | Lee |
| 8,026,122 B1 | 9/2011 | Lee |
| 8,142,521 B2 | 3/2012 | Wieting |
| 8,168,463 B2 | 5/2012 | Wieting |
| 8,178,370 B2 | 5/2012 | Lee et al. |
| 8,183,066 B2 | 5/2012 | Lee et al. |
| 8,217,261 B2 | 7/2012 | Wieting |
| 2002/0002992 A1 | 1/2002 | Kariya et al. |
| 2002/0004302 A1 | 1/2002 | Fukumoto et al. |

| | | | | | | |
|---|---|---|---|---|---|---|
| 2002/0061361 A1 | 5/2002 | Nakahara et al. | | 2009/0094844 A1* | 4/2009 | Shenderovich et al. ....... 33/18.1 |
| 2002/0063065 A1 | 5/2002 | Sonoda et al. | | 2009/0145746 A1 | 6/2009 | Hollars |
| 2003/0075717 A1 | 4/2003 | Kondo et al. | | 2009/0217969 A1 | 9/2009 | Matsushima et al. |
| 2003/0089899 A1 | 5/2003 | Lieber et al. | | 2009/0234987 A1 | 9/2009 | Lee et al. |
| 2003/0188777 A1 | 10/2003 | Gaudiana et al. | | 2009/0235983 A1 | 9/2009 | Girt et al. |
| 2003/0230338 A1 | 12/2003 | Menezes | | 2009/0235987 A1 | 9/2009 | Akhtar et al. |
| 2004/0063320 A1 | 4/2004 | Hollars | | 2009/0293945 A1 | 12/2009 | Peter |
| 2004/0084080 A1 | 5/2004 | Sager et al. | | 2010/0081230 A1 | 4/2010 | Lee |
| 2004/0095658 A1 | 5/2004 | Buretea et al. | | 2010/0087016 A1 | 4/2010 | Britt et al. |
| 2004/0110393 A1 | 6/2004 | Munzer et al. | | 2010/0087026 A1 | 4/2010 | Winkeler et al. |
| 2004/0187917 A1 | 9/2004 | Pichler | | 2010/0087027 A1 | 4/2010 | Wieting |
| 2004/0191949 A1 | 9/2004 | Iwata et al. | | 2010/0096007 A1 | 4/2010 | Mattmann et al. |
| 2004/0191950 A1 | 9/2004 | Nakamura et al. | | 2010/0101648 A1 | 4/2010 | Morooka et al. |
| 2004/0245912 A1 | 12/2004 | Thurk et al. | | 2010/0101649 A1 | 4/2010 | Huignard et al. |
| 2004/0252488 A1 | 12/2004 | Thurk | | 2010/0122726 A1 | 5/2010 | Lee |
| 2004/0256001 A1 | 12/2004 | Mitra et al. | | 2010/0197051 A1 | 8/2010 | Schlezinger et al. |
| 2005/0074915 A1 | 4/2005 | Tuttle et al. | | 2010/0210064 A1 | 8/2010 | Hakuma et al. |
| 2005/0098205 A1 | 5/2005 | Roscheisen et al. | | 2010/0224247 A1 | 9/2010 | Bartholomeusz et al. |
| 2005/0109392 A1 | 5/2005 | Hollars | | 2010/0233386 A1 | 9/2010 | Krause et al. |
| 2005/0164432 A1 | 7/2005 | Lieber et al. | | 2010/0258179 A1 | 10/2010 | Wieting |
| 2005/0194036 A1 | 9/2005 | Basol | | 2010/0267189 A1 | 10/2010 | Yu et al. |
| 2005/0223570 A1 | 10/2005 | Yonezawa et al. | | 2010/0267190 A1 | 10/2010 | Hakuma et al. |
| 2005/0287717 A1 | 12/2005 | Heald et al. | | 2010/0297798 A1 | 11/2010 | Adriani et al. |
| 2006/0034065 A1 | 2/2006 | Thurk | | 2011/0018103 A1 | 1/2011 | Wieting |
| 2006/0040103 A1 | 2/2006 | Whiteford et al. | | 2011/0020980 A1 | 1/2011 | Wieting |
| 2006/0051505 A1 | 3/2006 | Kortshagen et al. | | 2011/0070682 A1 | 3/2011 | Wieting |
| 2006/0096536 A1 | 5/2006 | Tuttle | | 2011/0070683 A1 | 3/2011 | Wieting |
| 2006/0096537 A1 | 5/2006 | Tuttle | | 2011/0070684 A1 | 3/2011 | Wieting |
| 2006/0096635 A1 | 5/2006 | Tuttle | | 2011/0070685 A1 | 3/2011 | Wieting |
| 2006/0102230 A1 | 5/2006 | Tuttle | | 2011/0070686 A1 | 3/2011 | Wieting |
| 2006/0112983 A1 | 6/2006 | Parce et al. | | 2011/0070687 A1 | 3/2011 | Wieting |
| 2006/0130890 A1 | 6/2006 | Hantschel et al. | | 2011/0070688 A1 | 3/2011 | Wieting |
| 2006/0160261 A1 | 7/2006 | Sheats et al. | | 2011/0070689 A1 | 3/2011 | Wieting |
| 2006/0173113 A1 | 8/2006 | Yabuta et al. | | 2011/0070690 A1 | 3/2011 | Wieting |
| 2006/0174932 A1 | 8/2006 | Usui et al. | | 2011/0071659 A1 | 3/2011 | Farris, III et al. |
| 2006/0180197 A1 | 8/2006 | Gui et al. | | 2011/0073181 A1 | 3/2011 | Wieting |
| 2006/0219288 A1 | 10/2006 | Tuttle | | 2011/0203634 A1 | 8/2011 | Wieting |
| 2006/0219547 A1 | 10/2006 | Tuttle | | 2011/0212565 A1 | 9/2011 | Wieting |
| 2006/0220059 A1 | 10/2006 | Satoh et al. | | 2011/0259395 A1 | 10/2011 | Wieting et al. |
| 2006/0249202 A1 | 11/2006 | Yoo et al. | | 2011/0259413 A1 | 10/2011 | Wieting et al. |
| 2006/0267054 A1 | 11/2006 | Martin et al. | | 2011/0269260 A1 | 11/2011 | Buquing |
| 2007/0004078 A1 | 1/2007 | Alberts | | 2011/0277836 A1 | 11/2011 | Lee |
| 2007/0006914 A1 | 1/2007 | Lee | | 2012/0003789 A1 | 1/2012 | Doering et al. |
| 2007/0089782 A1 | 4/2007 | Scheuten et al. | | 2012/0018828 A1 | 1/2012 | Shao |
| 2007/0116892 A1 | 5/2007 | Zwaap et al. | | 2012/0021552 A1 | 1/2012 | Alexander et al. |
| 2007/0116893 A1 | 5/2007 | Zwaap | | 2012/0094432 A1 | 4/2012 | Wieting |
| 2007/0151596 A1 | 7/2007 | Nasuno et al. | | 2012/0122304 A1 | 5/2012 | Wieting |
| 2007/0163643 A1 | 7/2007 | Van Duren et al. | | 2012/0186975 A1 | 7/2012 | Lee et al. |
| 2007/0163646 A1* | 7/2007 | Kushiya et al. ................ 136/264 | | | | |
| 2007/0169810 A1 | 7/2007 | Van Duern et al. | | | | |
| 2007/0193623 A1 | 8/2007 | Krasnov | | | | |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | 2006/126598 A1 | 11/2006 |
| WO | 2007/022221 A2 | 2/2007 |
| WO | 2007/077171 A2 | 7/2007 |
| WO | 2008/025326 A2 | 3/2008 |

| | | |
|---|---|---|
| 2007/0209700 A1 | 9/2007 | Yonezawa et al. |
| 2007/0243657 A1 | 10/2007 | Basol et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1 | 2/2008 | Milshtein et al. |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 | 4/2008 | Lee |
| 2008/0092954 A1 | 4/2008 | Choi |
| 2008/0105294 A1 | 5/2008 | Kushiya et al. |
| 2008/0110491 A1 | 5/2008 | Buller et al. |
| 2008/0110495 A1 | 5/2008 | Onodera et al. |
| 2008/0115827 A1 | 5/2008 | Woods et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0216886 A1 | 9/2008 | Iwakura |
| 2008/0280030 A1 | 11/2008 | Van Duren et al. |
| 2008/0283389 A1 | 11/2008 | Aoki |
| 2009/0021157 A1 | 1/2009 | Kim et al. |
| 2009/0058295 A1 | 3/2009 | Auday et al. |
| 2009/0084438 A1 | 4/2009 | den Boer et al. |
| 2009/0087940 A1 | 4/2009 | Kushiya |
| 2009/0087942 A1 | 4/2009 | Meyers |

OTHER PUBLICATIONS

Gordillo et al. "Electrical and morphological properties of low resistivity Mo thin films prepared by magnetron sputtering," 9Brazilian Journal of Physics 36:982-985 (Sep. 2006).

Grecu et al. "Spectroscopic Characterization of Chemical Bath Deposited Cadmium Sulphide Layers", Journal of Optoelectronics and Advanced Matenals 6:127-132 (Mar. 2004).

Onuma et al., Preparation and Characterization of CuInS Thin Films Solar Cells with Large Grain, Elsevier Science B.V; Solar Energy Materials & Solar Cells 69 (2001) pp. 261-269.

Palm et al. "Second generation CIS solar modules," Solar Energy 77:757-765 (Dec. 2004).

Scofield "Sodium diffusion, selenization, and microstructural effects associated with various molybdenum back contact layers for CIS-based solar cells", Proceedings of the 24th IEEE Photovoltaic Specialists Conference, pp. 164-167 (1995).

Baumann, A., et al., Photovoltaic Technology Review, presentation Dec. 6, 2004, 18 pages.

Chopra et al., "Thin-Film Solar Cells: An Overview", 2004, Progress in Photovoltaics: Research and Applications, 2004, vol. 12, pp. 69-92.

Guillen C., "CuInS$_2$ Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of $CuIn_{1-x}Ga_xSe_2$ Solar Cells on Rigid and Flexible Substrates using Nanoparticle Precursor Inks", Thin Solid Films, 2003, vol. 431-432, pp. 53-57.

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Mehta et al., "A graded diameter and oriented nanorod-thin film structure for solar cell application: a device proposal", Solar Energy Materials & Solar Cells, 2005, vol. 85, pp. 107-113.

Salvador, "Hole diffusion length in $n$-TiO$_2$ single crystals and sintered electrodes: photoelectrochemical determination and comparative analysis," Journal of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/Polymer Composite Doped with Tetraphenylbenzidine Single Layer Structure Light-emitting Diode", Applied Physics Letters, vol. 69, No. 3, Jul. 15 1996, pp. 377-379.

\* cited by examiner

MANUFACTURING METHOD FOR PATTERNING CIGS/CIS SOLAR CELLS

CROSS-REFERENCE TO RELATED APPLICATIONS

This application claims priority to U.S. Provisional Patent Application No. 61/221,043, filed Jun. 27, 2009, entitled "MANUFACTURING METHOD FOR PATTERNING CIGS/CIS SOLAR CELLS" by inventor Robert D. Wieting, commonly assigned and incorporated by reference herein for all purposes.

BACKGROUND OF THE INVENTION

The present invention relates generally to photovoltaic materials and manufacturing method. More particularly, the present invention provides a method and structure for fabricating shaped thin-film solar cells. Merely by way of example, the present method and structure include a patterned thin film stack layer for the manufacture of copper indium gallium diselenide based thin-film photovoltaic devices in tubular shape, but it would be recognized that the invention may have other configurations.

In the process of manufacturing CIS and/or CIGS types of thin films on substrates with planar, tubular, cylindrical, circular or other flexible shapes, there are various manufacturing challenges, such as maintaining structure integrity of substrate materials, ensuring uniformity and granularity of the thin film material, etc. While conventional techniques in the past have addressed some of these issues, they are often inadequate in various situations. Therefore, it is desirable to have improved systems and method for manufacturing thin-film photovoltaic devices on shaped substrates.

BRIEF SUMMARY OF THE INVENTION

Embodiments according to the present invention relates to photovoltaic materials and manufacturing method. More particularly, the present invention provides a method and structure for fabricating thin-film solar cells on shaped substrates. Merely by way of example, the present method and structure provide a patterned thin film stack layer for the manufacture of copper indium gallium diselenide based thin-film photovoltaic devices on tubular substrates, but it would be recognized that the invention may have other configurations.

In a specific embodiment, the present invention provides a method for patterning a shaped thin-film photovoltaic device. The method includes providing a length of tubular substrate including an electrode layer and an overlying absorber layer having a first thickness. Additionally, the method includes inserting the tubular substrate on a spindle. The spindle can be inflated to fasten the tubular substrate. The method further includes disposing a scribe device including a tip. The scribe device is configured to shift along the length of tubular substrate and apply pressure to the tip. The tip is placed on a first region of the absorber layer. Moreover, the method includes rotating the spindle to cause a rotation of the tubular substrate relative to the tip. The scribe device applies a pressure to the tip to form a first pattern into the absorber layer from the first region to extend around the tubular substrate and at least down to the first thickness.

In the specific embodiment, the method further includes forming a window layer having a second thickness overlying the absorber layer including the first pattern. Furthermore, the method includes disposing the scribe device including the tip near a second region of the window layer. The method further includes rotating the spindle to cause a rotation of the tubular substrate relative to the tip. The scribe device applies a pressure to the tip to form a second pattern into the window layer and the absorber layer from the second region to extend around the tubular substrate and at least down to the first thickness plus the second thickness.

In an alternative embodiment of the present invention, a method for forming a shaped thin-film photovoltaic device is provided. The method includes providing a shaped substrate member including a surface region and forming a first electrode layer overlying the surface region. Additionally, the method includes forming an absorber comprising copper species, indium species, and selenium species overlying the first electrode layer. The method further includes scribing through the absorber using a mechanical tip to form a first pattern. Furthermore, the method includes forming a window layer comprising cadmium sulfide species overlying the absorber including the first pattern. Moreover, the method includes scribing through the window layer and the absorber using the mechanical tip to form a second pattern. The second pattern is separated a distance from the first pattern.

Many benefits can be achieved by ways of the embodiments according to the present invention. Particularly, the method provides a method for patterning a window layer together with an absorber layer on shaped substrate to form a photovoltaic cell in a specific embodiment. Preferably, the present method provides a clean scribe region free of particles and contaminants on an underlying electrode layer, for example, a molybdenum layer. Additionally the present thin-film photovoltaic cell on tubular substrate has an improved conversion efficiency compared to a conventional planar photovoltaic cell by enhancing the sunlight absorption in more angles and provides a cost effective way to convert sunlight into electric energy. Depending on the embodiment, one or more of these benefits may be achieved. These and other benefits will be described in more detailed throughout the present specification and particularly below.

DETAILED DESCRIPTION OF THE INVENTION

Embodiments according to the present invention relates to photovoltaic materials and manufacturing method. More particularly, the present invention provides a method and structure for fabricating thin-film solar cells on shaped substrates. Merely by way of example, the present method and structure provide a patterned thin film stack layer for the manufacture of copper indium gallium diselenide based thin-film photovoltaic devices on tubular substrates, but it would be recognized that the invention may have other configurations.

Figure 1:
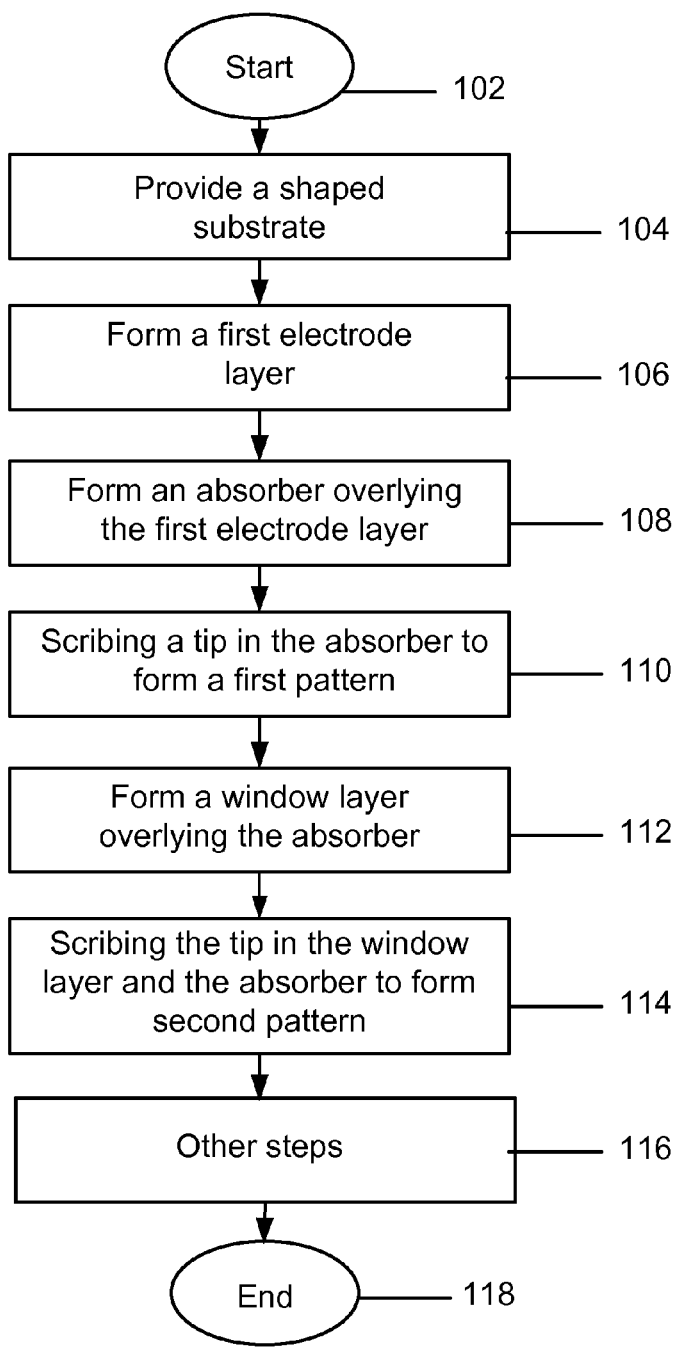
FIG. 1 is a simplified process flow diagram illustrating a method of fabricating a photovoltaic cell on shaped substrate according to an embodiment of the present invention.

FIG. 1 is a simplified process flow diagram illustrating a method of forming a photovoltaic cell on a shaped substrate according to an embodiment of the present invention. As shown, the method begins with a start step (step 102). In step 104, a shaped substrate is provided. In particular example, the shaped substrate has a cylindrical tubular shape characterized by a length, an inner diameter and an outer diameter. A circumferential surface region is defined by the length and the outer diameter. The tubular shaped substrate, or simply the tubular substrate, can be made of a transparent material like glass. In a specific embodiment, soda lime glass is used to make the tubular substrate. Other transparent materials may also be used including fused silica, quartz, and others. Other shaped substrates including cylindrical rod, sphere, semi-cylindrical tile, and other non-planar or even flexible foil can be used according to one or more embodiments of the present invention.

In step 106, an electrode layer is deposited overlying the surface of the shaped substrate. In a specific embodiment, a first electrode layer is formed overlying the circumferential surface region of the tubular substrate. The first electrode layer can be provided by molybdenum material and alloy in a specific embodiment. The formation process can be a physical vapor deposition of the molybdenum over the circumferential outer surface region of a rotating tubular substrate. Other electrode materials such as transparent conductive oxide material, other metal materials may also be used, depending on the applications.

The method further includes forming an absorber layer overlying the first electrode layer (step 108). In a specific embodiment, the absorber layer comprises copper species, indium (or indium-gallium) species, selenium species. In an implementation, the above mentioned material species are, separately or in certain combination, deposited using sputtering technique while a tubular substrate is rotated at a predetermined speed. After the formation of these materials species overlying the electrode layer, one or more treatment steps can lead to the formation of a first thickness of copper indium (gallium) diselenide (CIGS) or a copper indium diselenide (CIS) compound material, which is a p-type semiconductor in electronic nature and serves as an absorber layer for forming photovoltaic cells.

In an embodiment, the method includes a process of patterning the absorber layer using mechanical scribing technique. In step 110 a scribe device including a tip can be disposed near a surface region of the formed absorber layer over the tubular substrate. The absorber layer is formed overlying a first electrode layer on the circumferential surface region of the tubular substrate. In a specific embodiment, the tubular substrate is inserted onto a spindle which is inflated to fasten with the inner surface of the tubular substrate. As the spindle rotates, the absorber layer also rotates or moves relative to the scribing tip at a preselected speed. The scribe device then applies a predetermined pressure to the tip to scribe into the absorber layer down to a certain depth. Thus, a recessed channel into the film can be formed along a path of the tip. The scribing action can be performed continuously as the tubular substrate rotates multiple turns until a first pattern is formed, depending on the embodiments. In an embodiment, the scribing depth by the tip at least is substantially equal to the first thickness of the absorber layer so that a portion of the first electrode layer is exposed.

The method for manufacturing photovoltaic cells on the tubular substrate further includes a process (step 112) of forming a window layer with a second thickness overlying the patterned absorber layer. In an embodiment, the window layer is made of cadmium sulfide material which has a wide band gap allowing the photons from sun light to reach the absorber layer and be converted into electric current. In one example, the first pattern is used for forming certain electric coupling of the cell elements including absorber/window layers and cell's bottom (the first) electrode. Again, during the formation of window layer material overlying the absorber layer, the tubular substrate is rotated via the spindle at a predetermined speed to achieve uniform growth and corresponding treatment of the window layer.

The method further subjects a selected surface region of the window layer to the scribe device with the tip to form a second pattern. In step 114, the scribe device with the tip can be the same device mentioned in step 110. The selected surface region is aligned to a specific location shifted a distance away from the first pattern formed before (in step 110). Again, the scribe device is configured to apply a predetermined pressure to the tip to scribe into the window layer from the selected surface region. At the same time, a relative motion between the tip and the tubular substrate is activated. In a specific embodiment, the tubular substrate is rotated at a selected speed through a spindle on which the substrate is inserted. In another specific embodiment, the predetermined pressure applied to the tip allows the tip scribing into a depth beyond the second thickness of the window layer and further through the first thickness of the absorber layer beneath. The rotation (speed and number of turns) of the tubular substrate and the applied pressure on the tip are complimentary parameters optimized for mechanically forming a second pattern through both the window layer and the absorber layer on a tubular shaped substrate.

In a specific embodiment, the method performs other steps to complete the photovoltaic cell. These other steps (116) can include forming a second electrode layer overlying the window layer including the second pattern formed in step 114, sealing the photovoltaic cell, framing, among others. In a specific embodiment, the second electrode layer can be a transparent conductive oxide such as indium tin oxide (commonly called ITO), fluorine doped tin oxide, and the like. The second electrode layer can be deposited using techniques such as sputtering, physical vapor deposition, solution based deposition, and others. The method ends with an end step (Step 118). Of course there can be other variations, modifications, and alternatives.

The above sequence of steps provides a method of forming and patterning a photovoltaic device on a shaped substrate according to an embodiment of the present invention. As shown, the method includes a step of mechanically scribing a tip down to certain depth of one or more layers on the shaped substrate to form one or more patterns therein in a specific embodiment. Depending on the embodiment, one or more steps may be added, one or more steps may be eliminated, and one or more steps may be performed in a different sequence without departing from the scope of the claims herein. One skilled in the art would recognize other variations, modifications, and alternatives.

Figure 2:
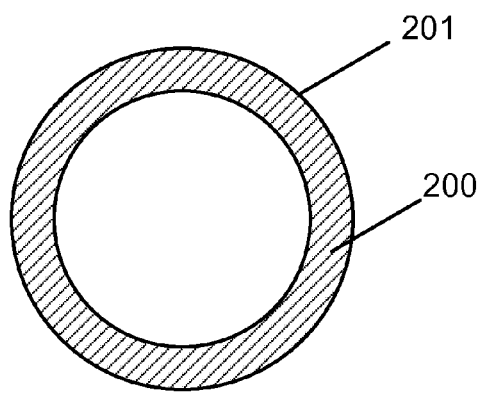
FIG. 2 is a simplified end sectional view illustrating an exemplary shaped substrate in tubular form for manufacturing a photovoltaic cell according to an embodiment of the present invention.

FIGS. 2-10 are simplified diagrams illustrating a method and structure for forming and patterning thin film photovoltaic devices on shaped substrates according to embodiments of the present invention. These diagrams are merely examples and should not unduly limit the claims herein. One skilled in the art would recognize other variations, modifications, and alternatives. As shown in FIG. 2, a shaped substrate member 200 including a surface region 201 is provided. The figure shows an end sectional view of an exemplary tubular shaped substrate according to a specific embodiment of the present invention. Of course, other shaped substrate such as cylindrical, hemi-cylindrical, circular, or flexible, non-planar shaped substrate can be applied with non-essential modifications.

In a specific embodiment, the shaped substrate member can be a glass material such as soda lime glass in certain embodiment. Other suitable transparent materials such as quartz, fused silica, solar glass can also be used. The shaped substrate member, in a specific embodiment, has a tubular shape characterized by an inner diameter and an outer diameter in this end sectional view and a length (not shown). Other non-planar spatial shapes can be used depending on applications. In one or more embodiments, each of the shaped substrate member can include a barrier layer (not explicitly shown) deposited on the surface region. The barrier layer prevents sodium ions from the soda lime glass material to diffuse into photovoltaic thin film formed thereon in a specific embodiment. The barrier layer can be a dielectric material such as silicon oxide deposited using physical vapor deposition technique such as a sputtering process, or a chemical vapor deposition process including plasma enhanced processes, and others. Other barrier materials may also be used. These barrier materials include aluminum oxide, titanium nitride, silicon nitride, tantalum oxide, zirconium oxide depending on the embodiment.

Figure 3:
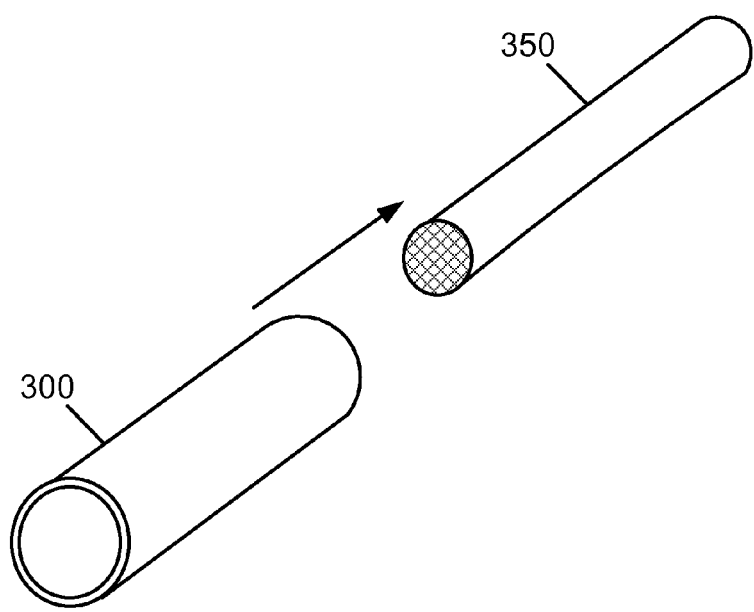
FIG. 3 is a simplified perspective view illustrating a method of providing a tubular substrate for manufacturing a photovoltaic cell according to an embodiment of the present invention.

FIG. 3 is a simplified perspective view illustrating a method of providing a tubular substrate for manufacturing a photovoltaic cell according to an embodiment of the present invention. As shown, the method includes providing a spindle 350 having a diameter smaller than the inner diameter of the tubular substrate 300. The tubular substrate 300 then can be inserted on the spindle 350. The spindle 350, of course, is coupled to a motor (not shown) that can drive a rotational motion of the spindle at a variety of rotational speeds. In an implementation, the controlled motor spindle is part of the substrate loading/supporting apparatus used for manufacturing photovoltaic cells on tubular or other shaped substrates.

Figure 4:
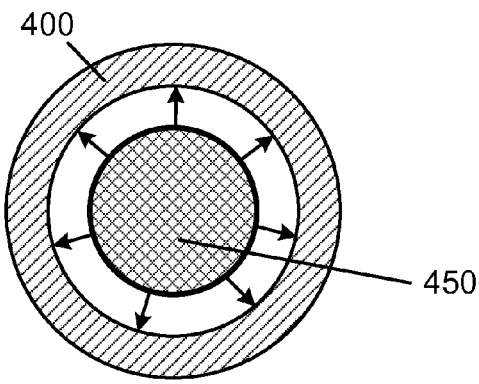
FIG. 4 is a simplified end sectional view illustrating a method of providing a tubular substrate for manufacturing a photovoltaic cell according to an embodiment of the present invention.

FIG. 4 is a simplified end sectional view illustrating a method of providing a tubular substrate for manufacturing a photovoltaic cell according to an embodiment of the present invention. As shown, the tubular substrate 400 has a spindle 450 being inserted on. In a specific embodiment, the spindle 450 comprises an inflatable surface region that can be enlarged in radial direction and eventually fasten with the inner surface of the tubular substrate 400. As a result, the tubular substrate 400 becomes mechanically integrated with the spindle 450. The integration of the tubular substrate by the fastened spindle provides a mechanical support for the substrate for the up-coming thin film processes as well as a motion control of the substrate by the spindle. Any motion, especially a rotation, of the spindle 450 can cause a same motion of the tubular substrate 400.

Figure 5:
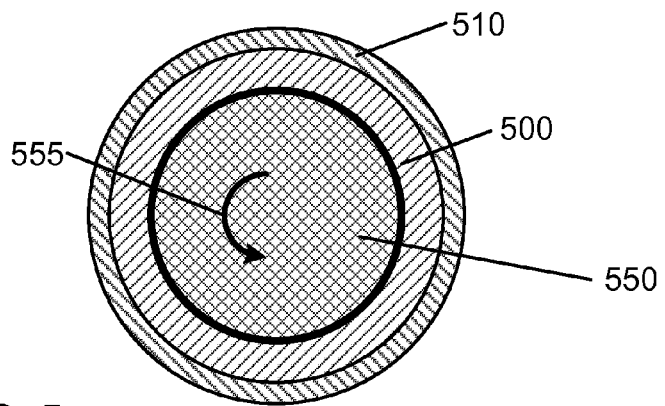
FIG. 5 is a simplified end sectional view illustrating a tubular substrate including an overlying electrode layer for manufacturing a photovoltaic cell according to an embodiment of the present invention.

FIG. 5 is a simplified end sectional view illustrating a tubular substrate including an overlying electrode layer for manufacturing a photovoltaic cell according to an embodiment of the present invention. As shown in a specific embodiment of the present invention, a shaped substrate is provided as a tubular substrate 500. A spindle 550 is inserted in central open space of the substrate 500, in a way similar to that described in FIG. 3. After that, the spindle 550 is inflated to fasten with the inner surface of the tubular substrate 500. In a specific embodiment, the spindle 550 is coupled to a motor (not shown) which drives the spindle in a rotational motion at one or more speeds. As shown, the tubular substrate 500 is provided for forming a first electrode layer 510 overlying its circumferential surface region while the substrate 500 is rotated along direction 555 caused by rotation of the spindle 550. The first electrode layer may be provided using a transparent conductor oxide (TCO) such as indium tin oxide (commonly called ITO), fluorine doped tin oxide, and the like. In certain embodiments, the first electrode layer is provided by a metal material. The metal material can be a molybdenum material or alloy in a specific embodiment. The molybdenum material can be formed using deposition techniques such as sputtering, plating, physical vapor deposition (including evaporation, sublimation), chemical vapor deposition (including plasma enhanced processes).

Molybdenum material provides certain advantage over other electrode material for a CIG or CIGS based thin-film photovoltaic cells. For example, molybdenum material provides a low contact resistance for CIGS/CIS film (to be formed) and film stability over subsequent processing steps. In a specific embodiment, molybdenum material is formed by depositing a first molybdenum layer overlying the tubular substrate 500 with a tensile stress characteristics followed by a second molybdenum layer having a compression stress characteristics. In a specific embodiment, the first electrode layer comprising the molybdenum material can be further patterned by a laser treatment. Further details of deposition and patterning of the molybdenum material can be found at least in U.S. Provision Application No. 61/101,646 filed Sep. 30, 2008 and U.S. Provision Application No. 61/101,650 filed Sep. 30, 2008, commonly assigned, and hereby incorporate by reference. Of course, there can be other variations, modifications, and alternatives.

Figure 6:
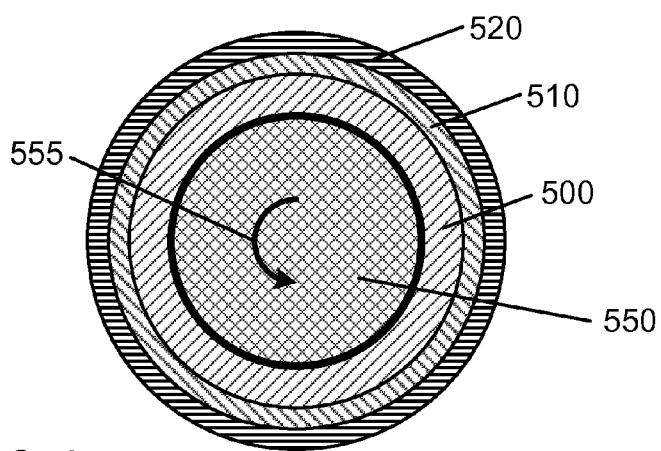
FIG. 6 is a simplified end sectional view illustrating the tubular substrate including the overlying electrode layer plus an absorber layer for manufacturing a photovoltaic cell according to an embodiment of the present invention.

FIG. 6 is a simplified end sectional view illustrating the tubular substrate including the overlying electrode layer plus an absorber layer for manufacturing a photovoltaic cell according to an embodiment of the present invention. As shown, in a similar controlled supporting scheme by the spindle 550, the tubular substrate 500 including the overlying first electrode layer 510 has its surface exposed for growing one or more material species including deposition and thermal treatment. In an embodiment, an absorber layer 520 having a first thickness can be formed overlying the first electrode layer 510 throughout its circumferential surface while the substrate 500 is keeping rotating caused by the spindle 550 along direction 555. In a specific embodiment, the formation of the absorber layer 520 can be a two-step process: first depositing multiple materials including copper species, indium species (or indium-gallium alloy) over the molybdenum surface; second performing a thermal selenization and sulfurization treatment in an environment including gaseous selenium species and/or sulfide species to induce a transformation of the previously deposited materials into the absorber layer containing copper indium diselenide (CIS) compound material or copper indium gallium diselenide (CIGS) compound material.

In an embodiment, the absorber layer 520 with CIGS/CIS material is a p-type semiconductor material that can be used as photo absorption layer for a photovoltaic cell. Typically, the p-type characteristics may be provided using dopants such as boron or aluminum species. Further details of the formation of the absorber material may be found in Provisional U.S. Patent Application No. 61/059,253, titled "High Efficiency Photovoltaic Cell and Manufacturing Method" and Provisional U.S. Patent Application No. 61/178,459 titled "Method and System for Selenization in Fabricating CIGS/CIS Solar Cells," commonly assigned, and hereby incorporated by reference.

Figure 7A:
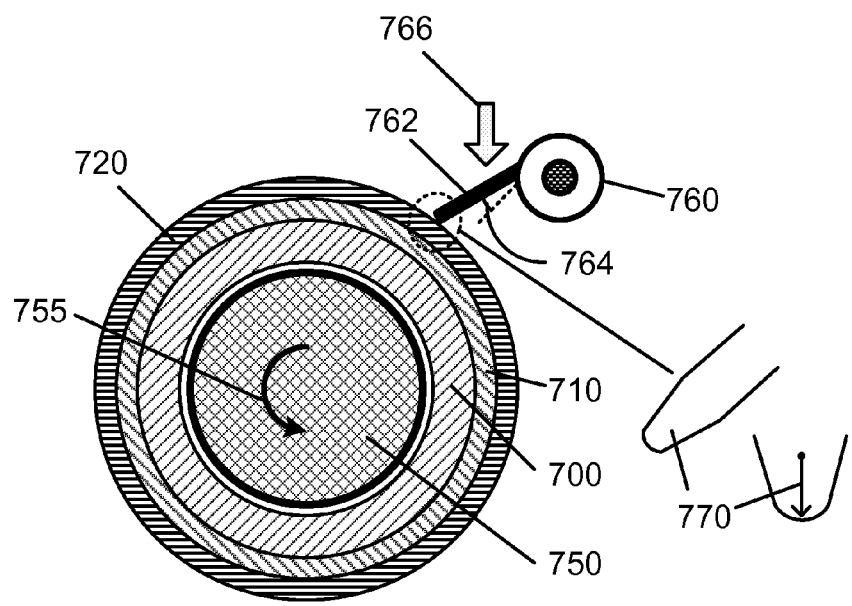
FIG. 7A is a simplified end sectional view illustrating a method of patterning an absorber layer overlying an electrode layer on a tubular substrate for manufacturing a photovoltaic cell according to an embodiment of the present invention.

FIG. 7A is a simplified end sectional view illustrating a method of patterning an absorber layer overlying an electrode layer on a tubular substrate for manufacturing a photovoltaic cell according to an embodiment of the present invention. As shown, the tubular substrate 700 is provided by a fastened spindle 750 that is rotatable along a direction 755. Over the tubular substrate 700, an electrode layer 710 is formed followed by an absorber layer 720 based on the processes described in earlier paragraphs. In an embodiment, a scribe device 760 is disposed near one or more regions of an outer surface of the absorber layer 720 for forming one or more patterns in the absorber layer. The scribe device 760 includes a tip element 762 which can be a mechanical stylus having superior mechanical strength. In a specific embodiment, the scribe device 760 is configured to apply certain pressures 766 onto the tip element 762. The pressure value is adjustable depending on the film material and a desired depth of the one or more patterns that the mechanical stylus will scribe. Of course, there can be many variations, modifications, and alternatives. More detail description about the scribe device and patterning process is shown below.

Referring to the FIG. 7A, the method includes using a scribe device with a mechanical stylus as a scribing head for forming one or more patterns into the absorber layer on the tubular substrate. In a specific embodiment, the scribe device 760 is configured to pivot or align the mechanical stylus 762 to a selected position of the surface region of the absorber layer 720, as shown in the end sectional view of FIG. 7A. The scribe device 760 can be moved along the length direction of the tubular substrate 700 to adjust the selected position and also can be fixed during a patterning process. The patterning process is performed as the fixed scribe device 760 applies a predetermined pressure 766 to the mechanical stylus or the tip 762 while the tubular substrate 700 is rotating (caused by the rotatable spindle 750) at a proper speed. The applied pressure 766 can be caused through a pressure-spring, a weight, or the like. As a result of the pressure 766 and relative motion between the tip and the absorber surface, the tip 762 is able to dial in a force to maintain the tip scribing into the absorber layer 720. During the scribing process, the tubular substrate 700 can rotate over multiple turns to form a recessed spatial region or channel having a depth substantially equal to or greater than the first thickness of the absorber layer 720.

Referring to the enlarged portion in FIG. 7A, in a specific embodiment, the tip is characterized by a radius 770 ranging from about 20 microns to about 40 microns and preferably 25 microns and more. In another specific embodiment, the tip 762 is configured to be at an angle 764 relative to a surface normal of the absorber layer 720. The angle 764 can be ranging from about zero degrees to about 40 degrees and preferably between 10 degrees and 20 degrees depending on the embodiment. In a specific embodiment, the tip is configured to be at an angle of about 15 degrees to the surface normal. The tip can be made of material such as diamond, tungsten carbide, or silicon carbide, and the like. Other materials having sufficient hardness may also be used for the tip depending on the application. Of course there can be other variations, modifications, and alternatives.

Figure 7B:
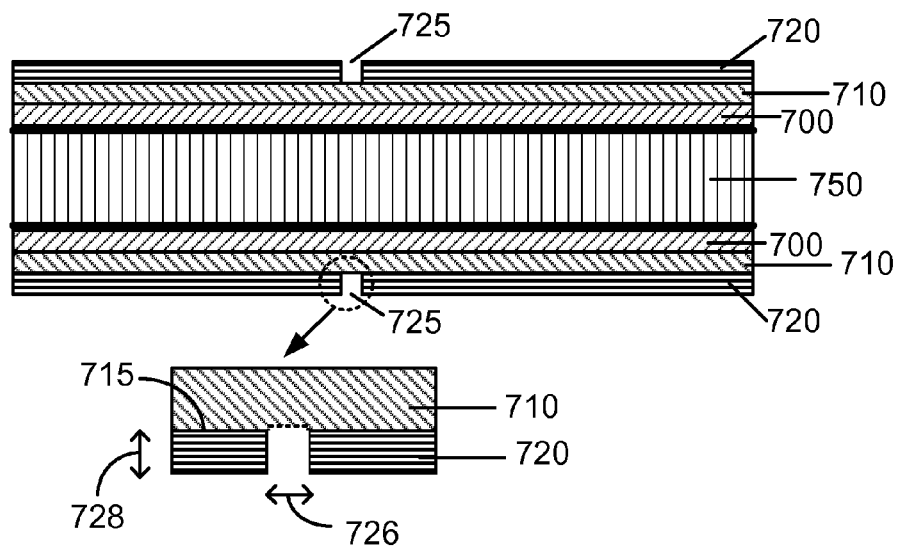
FIG. 7B is a simplified side sectional view along the length of the tubular substrate including the overlying electrode layer plus a patterned absorber layer for manufacturing a photovoltaic cell according to an embodiment of the present invention.

FIG. 7B is a simplified side sectional view along the length of the tubular substrate including the overlying electrode layer plus a patterned absorber layer for manufacturing a photovoltaic cell according to an embodiment of the present invention. In this side sectional view, the recessed spatial region 725 scribed by the tip 762 into the absorber layer 720 can be directly seen. As shown in a specific embodiment, the tip substantially stops at the underlying molybdenum surface. An enlarged cross sectional view shows the recessed spatial region 725 with a width 726 and a depth equal to or greater than the first thickness of the absorber layer 720. In a specific embodiment, the first electrode layer with molybdenum material includes an interface layer 715 formed from the absorber layer material and the molybdenum material. In a specific embodiment, the interface layer 715 comprises a graded material characterized by a $MoSe_x$ species or a $MoS_y$ species depending on the absorber material used. The graded material can have a thickness of about 100 Angstroms in a specific embodiment. As shown, the scribe region extends through a thickness 728 of the absorber layer 720 and the interface layer 715 but no greater than 200 Angstroms into the molybdenum layer 710 in a preferred embodiment. In a specific embodiment, the selected region by the scribe device via the tip 762 allows the absorber layer 720 to be aligned with underlying molybdenum layer 710 which has been pre-patterned by laser treatment. The width 726 of the formed pattern 725 ranges from about 30 microns to about 100 microns in a specific embodiment. In another specific embodiment, the pattern 725 can have a width of about 50 microns. Additionally, the one or more rotational passes of the tubular substrate 700 allows the scribed area to be substantially cleaned and free of contaminants and particles thus providing a lower contact resistivity and good Ohmic contact to electric interconnects for a photovoltaic cell in a specific embodiment. Further, the pattern region separates a first photovoltaic region (or a first PV cell) from a second photovoltaic region (or second PV cell) without shorting in a preferred embodiment. In a specific embodiment, the scribe device 760 is substantially fixed while the tubular substrate 700 rotates at a predetermined speed at about 0.25 meter per second and greater, or may be slightly less. Of course there can be other variations, modifications, and alternatives.

Figure 8:
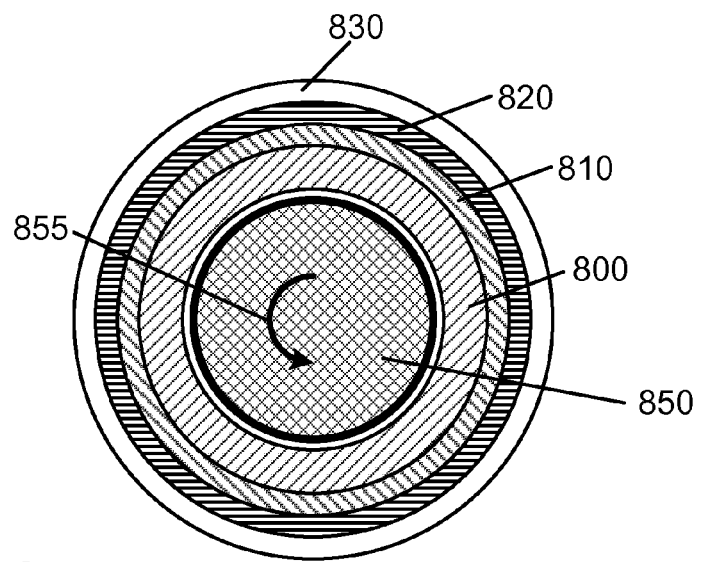
FIG. 8 is a simplified end sectional view illustrating the tubular substrate including an window layer overlying the absorber layer for manufacturing a photovoltaic cell according to an embodiment of the present invention.

FIG. 8 is a simplified end sectional view illustrating the tubular substrate including an window layer overlying the absorber layer for manufacturing a photovoltaic cell according to an embodiment of the present invention. As shown, the method for manufacturing a photovoltaic cell on shaped substrate 800 further includes forming a window layer 830 overlying a previously formed absorber layer 820 and an electrode layer 810. In a specific embodiment, the shaped substrate 800 is a tubular substrate substantially the same as the tubular substrate 700, 500, and 400. The window layer 830 comprising a cadmium sulfide overlying the absorber layer 820 comprising CIGS/CIS material to provide a photovoltaic film stack material. The photovoltaic film stack forms a pn junction of a photovoltaic cell. In a specific embodiment, the window layer can be deposited using techniques such as sputtering, vacuum evaporation, chemical bath deposition, among others. In an embodiment, the window layer often uses a wide bandgap n-type semiconductor material for the p-type absorber layer. In a specific embodiment, the window layer should have suitable optical characteristics and suitable electrical properties for photovoltaic solar cell to be formed. For example, transparent conductive oxide such as zinc oxide material deposited by MOCVD technique can be used. The photovoltaic film stack material including both the window layer and the absorber layer is characterized by a brittle nature and the electrode layer comprising molybdenum material is a relatively hard metal. Of course, there can be other variations, modifications, and alternatives.

Figure 9A:
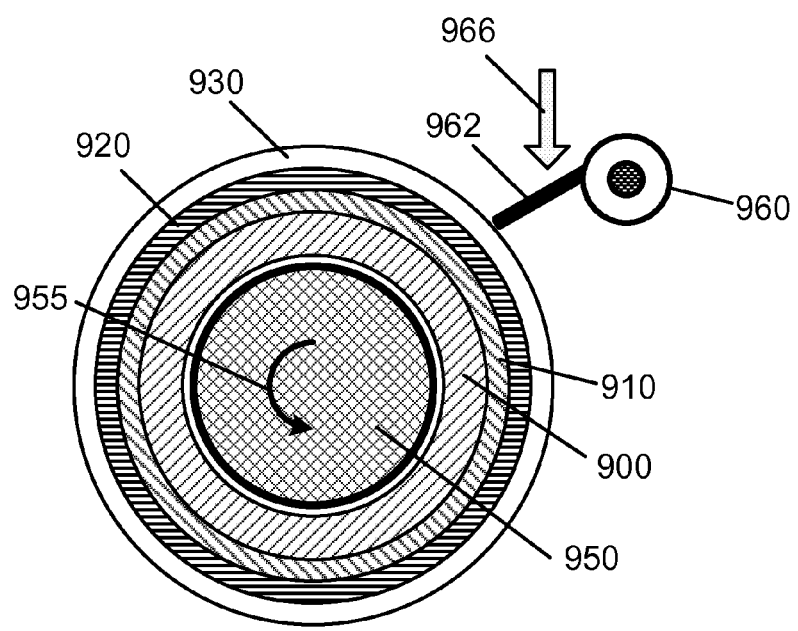
FIG. 9A is a simplified end sectional view illustrating a method of patterning a photovoltaic film stack including a window layer overlying an absorber layer on a tubular substrate for manufacturing a photovoltaic cell according to an embodiment of the present invention.

FIG. 9A is a simplified end sectional view illustrating a method of patterning a photovoltaic film stack including a window layer overlying an absorber layer on a shaped substrate for manufacturing a photovoltaic cell according to an embodiment of the present invention. As shown, a selected surface region of the photovoltaic film stack is subjected to a scribe device 960 including a stylus tip 962. The photovoltaic film stack is formed over a tubular substrate 900 provided by a fastened spindle 950. In particular, a first electrode layer 910 is formed firstly overlying the surface of the tubular substrate 900. Overlying the electrode layer 910, an absorber layer 920 with a first thickness is formed, including a first pattern at a selected region. A window layer 930 with a second thickness is then formed overlying the patterned absorber layer 920 to form the photovoltaic film stack. To manufacture a photovoltaic cell, the photovoltaic film stack needs to be patterned to fill in conductive material that can be used to couple with the electrode layer and electric interconnects.

Referring to FIG. 9A, the method includes subjecting one or more selected surface region of the photovoltaic film stack to the scribe device 960 with a mechanical stylus 962 to form a second pattern. As shown, similar to the process of forming the first pattern in the absorber layer the stylus or the tip 962 is applied a pressure 966 by the scribe device 960. At the same time, the tubular substrate 900 is rotated at a proper speed by rotating the spindle 950 along direction 955 so that the surface region of the window layer 930 moves relative to the fixed tip 962. In an embodiment, the scribe device 960 including the tip 762 is substantially the same as the scribe device 760 including the tip 762. As the scribing process continues with the tubular substrate 900 rotates one or more turns, the tip 962 under a proper pressure 966 can create a width of recessed spatial region with a depth substantially equal a sum of the first thickness of the absorber layer 920 and the second thickness of the window layer 930. In certain embodiment, the depth of the recessed spatial region can be slightly greater than the sum of the first thickness of the absorber layer 920 and the second thickness of the window layer 930 but extend into the electrode layer 910 no more than 200 Angstroms. This recessed spatial region scribed into the photovoltaic film stack with exposed portion of electrode layer is the second pattern formed using the mechanical scribing method according to an embodiment of the present invention. Of course, there are many variations, modifications, and alternatives.

Figure 9B:
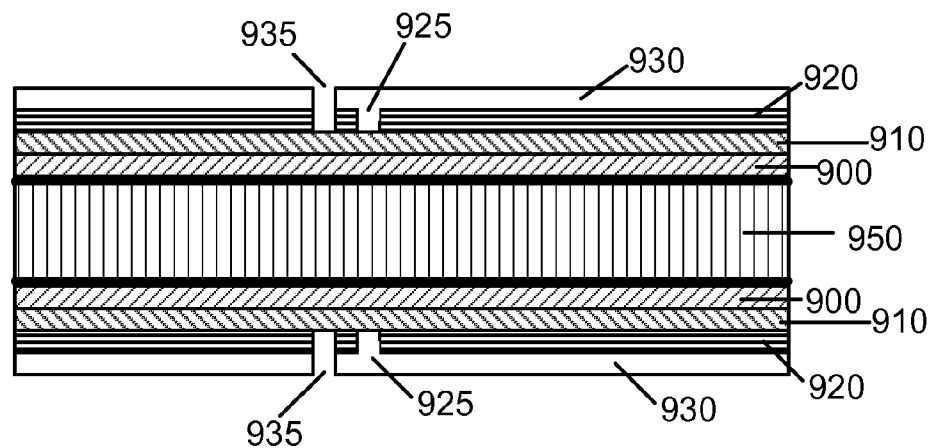
FIG. 9B is a simplified side sectional view along the length of the tubular substrate including the patterned window layer and the absorber layer for manufacturing a photovoltaic cell according to an embodiment of the present invention.

FIG. 9B is a simplified side sectional view along the length of the tubular substrate including the patterned window layer and the absorber layer for manufacturing a photovoltaic cell according to an embodiment of the present invention. In this side sectional view, the newly formed second pattern 935 is shown to have a depth of at least equal to the first thickness of the absorber layer 920 and the second thickness of the window layer 930. Additionally, it is shown that the second pattern 935 is a distance offset from the first pattern 925 formed in the absorber layer only. In fact, the recessed spatial region of the first pattern 925 is filled with the material of the window layer 930. In a specific embodiment, the depth of the second pattern into the photovoltaic film stack can be slightly greater than the sum of the first thickness and the second thickness so that the recessed spatial region extends through an interface region into the electrode layer. But the extended depth is no more than 200 Angstroms in one or more embodiments of the present invention. Of course, there can be variations, modifications, and alternatives.

In a specific embodiment, the second pattern has a width ranging from about 30 microns to about 100 microns. In another specific embodiment, the second pattern can have a width of about 50 microns. Additionally, the one or more turns that the tubular substrate 900 rotates via the spindle 950 allows the region scribed by the tip 962, i.e., the second pattern 935, to be substantially cleaned and free of contaminants and particles. The method for manufacturing photovoltaic cells further includes forming a second electrode layer onto the patterned photovoltaic film stack. Material of the second electrode layer will be filled into the formed second pattern 935. Without the contaminants and particles in the second pattern 935 a low contact resistivity and good Ohmic contact to interconnects for the photovoltaic cell can be provided. Further, the scribed region, including the first pattern 925 and the second pattern 935, separate a first photovoltaic region from a second photovoltaic region without shorting in a preferred embodiment. Of course there can be other variations, modifications, and alternatives.

Figure 10:
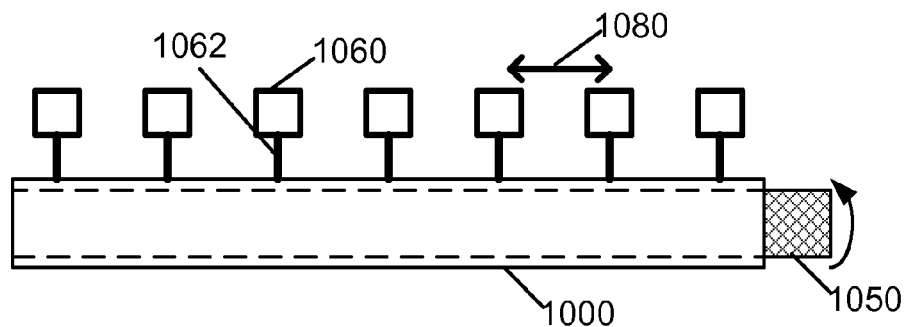
FIG. 10 is a simplified diagram illustrating a plurality of scribe devices disposed along the length of a shaped substrates for fabricating thin-film photovoltaic devices according to embodiments of the present invention.

FIG. 10 is a simplified diagram illustrating a plurality of scribe devices disposed along the length of a shaped substrates for fabricating thin-film photovoltaic devices according to embodiments of the present invention. As shown, in an alternative embodiment, multiple scribe devices 1060 can be disposed along the length of the tubular substrate 1000 for forming patterns at multiple selected regions. The tubular substrate 1000 can be inserted on a spindle 1050 which is fastened with inner surface of the tubular substrate 1000. Each scribe device 1060 includes a tip element and is configured to move its position along the length of the tubular substrate and pivot the tip near the outer surface of the substrate 1000. Each scribe device 1060 can be fixed once its tip is placed at a desired region of the outer surface of the substrate 1000. At the same time, the tubular substrate 1000 can rotate at a proper speed by rotating the spindle 1050 while the scribe device 1060 can apply a predetermined pressure to allow the tip dial in around the tubular substrate 1000. Each scribe device 1060 can be controlled independently to mechanically scribe a pattern into the film overlying the surface of the substrate 1000. In an embodiment, each scribe device is provided for patterning the photovoltaic film stack and generating a desired structure for forming electric coupling regions between photovoltaic cells or between a cell and output interconnects.

In a specific embodiment, the method for manufacturing a photovoltaic cell on shaped substrate performs other steps to complete the photovoltaic cell. These other steps can include cleaning the formed second pattern in the photovoltaic film stack by using a wire brush contact pad. The cleaning step ensures that the second pattern is substantially free from any contaminants or particles generated during the mechanical scribing process. Additionally, the method includes forming a second electrode layer overlying the window layer including the second pattern. In a specific embodiment, the second electrode layer can be a transparent conductive oxide such as indium tin oxide (commonly called ITO), fluorine doped tin oxide, and the like. The second electrode layer can be deposited using techniques such as sputtering, physical vapor deposition, solution based deposition, and others. The method also includes sealing the photovoltaic cell, isolating cell end, framing or laminating the cells, among others. Of course there can be other variations, modifications, and alternatives.

While the present invention has been described using specific embodiments, it should be understood that various changes, modifications, and variations to the method utilized in the present invention may be effected without departing from the spirit and scope of the present invention as defined in the appended claims. For example, the tubular shaped substrate is illustrated as an example. Other substrates in regular or irregular shape, planar or non-planar shape, rigid or flexible in mechanical characteristic, transparent or non-transparent (to visible light) in optical characteristic, and the like can be applied by the present invention. In an example, zinc oxide material is illustrated using boron as a dopant species. Other dopants such as hydrogen, aluminum, indium, gallium, and the likes may also be used. Additionally, although the above has been generally described in terms of a specific layered structure for CIS and/or CIGS thin-film photovoltaic cells, other specific CIS and/or CIGS thin film configurations can also be used, such as those noted in U.S. Pat. No. 4,612,411 and U.S. Pat. No. 4,611,091, which are hereby incorporated by reference herein, without departing from the invention described by the claims herein. Additionally, the present invention can be applied to other photovoltaic materials and configurations. Examples of these other thin film photovoltaic materials may include metal chalcogenide materials. Such metal chalcogenide materials can include metal oxides (for example, $ZnO$, $FeO$, $Fe_2O_3$, $CuO$, $Cu_2O$), metal sulfides (for example, iron sulfide, copper sulfide) metal selenides (for example, zinc selenide), and others. Depending on the embodiment, the present method can also be applied to silicon based photovoltaic devices. One of ordinary skill in the art would recognize other variations, modifications, and alternatives.

What is claimed is:

1. A method for patterning a shaped thin-film photovoltaic device, the method comprising:
    providing a length of tubular substrate including an electrode layer and an overlying absorber layer having a first thickness;
    inserting the tubular substrate on a spindle, the spindle being inflated to fasten the tubular substrate;
    disposing a scribe device including a tip, the scribe device being configured to shift along the length of tubular substrate and configured to apply pressure to the tip, the tip being placed on a first region of the absorber layer;
    rotating the spindle to cause a rotation of the tubular substrate relative to the scribe device, the scribe device applying a pressure to the tip to form a first pattern into the absorber layer from the first region to extend around the tubular substrate and at least down to the first thickness;
    forming a window layer having a second thickness overlying the absorber layer including the first pattern;
    disposing the scribe device including the tip near a second region of the window layer;
    rotating the spindle to cause a rotation of the tubular substrate relative to the scribe device, the scribe device applying a pressure to the tip to form a second pattern into the window layer and the absorber layer from the second region to extend around the tubular substrate and at least down to the first thickness plus the second thickness;
    wherein the tip is provided at an angle ranging from about normal to about 15 degrees relative to a surface normal of the absorber layer or window layer.

2. The method of claim 1 wherein the absorber layer comprises CIGS (copper indium gallium diselenide) material or CIS (copper indium diselenide) material.

3. The method of claim 1 wherein the scribe device uses a pressure-spring and/or a weight to apply pressure to the tip.

4. The method of claim 1 wherein the window layer comprises a cadmium sulfide material.

5. The method of claim 1 wherein the scribe device is pivoted to maintain a first pressure between the tip and the absorber layer and a second pressure between the tip and the window layer plus the absorber layer.

6. The method of claim 1 wherein rotating the spindle comprises rotating at a constant speed about ¼ meters per second or greater.

7. The method of claim 1 wherein rotating the spindle further comprises effectively using the tip for scribing through the first thickness or both the first thickness and the second thickness during multiple turns around the tubular substrate to form a recessed region of no greater than 200 Angstroms into the electrode layer.

8. The method of claim 1 wherein the tip comprises a radius of 25 microns and more.

9. The method of claim 1 wherein the tip comprises a radius ranging from about 20 microns to about 50 microns.

10. The method of claim 1 wherein the tip comprises a silicon carbide material.

11. The method of claim 1 wherein the tip comprises a diamond material.

12. The method of claim 1 wherein the tip comprises a tungsten carbide material.

13. The method of claim 1 wherein the first pattern comprises a width ranging from about 30 to 100 microns.

14. The method of claim 1 wherein the second pattern comprises a width ranging from about 30 to 100 microns and a lateral distance of about 30 to 100 microns away from the first pattern.

15. A method for forming a shaped thin-film photovoltaic device, the method comprising:
    providing a shaped substrate member including a surface region;
    forming a first electrode layer overlying the surface region;
    forming an absorber comprising copper species, indium species, and selenium species overlying the first electrode layer;
    scribing through the absorber using a mechanical tip to form a first pattern;
    forming a window layer comprising cadmium sulfide species overlying the absorber including the first pattern; and
    scribing through the window layer and the absorber using the mechanical tip to form a second pattern, the second pattern being separated a distance from the first pattern, wherein the method further comprises cleaning the first pattern and the second pattern free of contaminants and particles respectively following each scribing.

16. The method of claim 15 wherein the first electrode comprises molybdenum material.

17. The method of claim 15 wherein the mechanical tip comprises a stylus having a radius ranging from about 20 microns to about 50 microns, the stylus being made from material selected from diamond, silicon carbide, and tungsten carbide.

18. The method of claim 15 further comprising forming a second electrode layer comprising a transparent conductive oxide overlying the window layer including the second pattern.

\* \* \* \* \*